United States Patent [19]

Priest

[11] 4,203,092
[45] May 13, 1980

[54] ANALOGUE-TO-DIGITAL CONVERTER

[75] Inventor: Christopher C. A. Priest, Taplow, England

[73] Assignee: The Plessey Company Limited, Ilford, England

[21] Appl. No.: 944,020

[22] Filed: Sep. 20, 1978

[30] Foreign Application Priority Data

Oct. 1, 1977 [GB] United Kingdom ............... 40859/77

[51] Int. Cl.² ............................................. H03K 13/02
[52] U.S. Cl. ..................... 340/347 AD; 340/347 DA; 340/347 C
[58] Field of Search .... 340/347 C, 347 AD, 347 DA, 340/347 M; 179/15 A

[56] References Cited

U.S. PATENT DOCUMENTS

| | | | |
|---|---|---|---|
| 3,562,743 | 2/1971 | Lerouge | 340/347 DA |
| 3,889,063 | 6/1975 | Slavin | 340/347 C |

Primary Examiner—Charles D. Miller
Attorney, Agent, or Firm—Fleit & Jacobson

[57] ABSTRACT

The basic dual channel pcm coder/decoder arrangement provides PCM/Analogue Codec facilities for use in speech transmission and comprises (a) a pair of transmit channel amplifiers and a pair of receive channel amplifiers controllable for mutually exclusive operation by channel switches and (b) a comparator together with segment-defining ladder networks and associated current steering switching (and compensated current sources). In the encode (A-D), the unit functions as a successive approximation encoder; the particular transmit amplifier creates a voltage condition across the resistors of the two ladder networks and this condition is balanced by the voltage generated by the current sources. A null is consequently produced at the comparator input to govern the PCM output. In the decode mode, both transmit amplifiers are switched "off" and the requisite receive amplifier is switched "on". The PCM signal is presented to the ladder network switches so that the ladder network produces analogue voltages at its resistors and this is applied to the operative receive amplifier.

4 Claims, 5 Drawing Figures

ANALOGUE-TO-DIGITAL CONVERTER

The present invention relates to PCM encoder and decoder arrangements including an analogue-to-digital converter and more particularly to converters of the successive approximation type wherein one or more signals are compared with known analogue values to provide digital representations thereof.

The invention finds application in pulse code modulation (PCM) coder and decoder arrangements used in speech telephony in which coding is achieved in accordance with the A-law characteristic such as is defined in CCITT Green Book Vol. III part 2 G711. Coders and decoders operated in this manner require reference currents to be switched at fast speeds and accordingly electronic switching devices must be realised. In any electronic switching device the performance is limited by errors introduced for example by stray capacitances or inductances and transistor base currents. It is desirable therefore to provide a circuit arrangement which minimises or removes these affects without increasing the cost of such circuit arrangements. The invention can be realised using an integrated circuit and exploits the advantages offered by integrated circuit technology to provide an analogue-to-digital converter suitable for use in PCM speech telephony using low voltage power supplies having low power consumption and providing fast switching speeds.

Accordingly, an aim of the invention is to provide an analogue-to-digital converter which overcomes the above mentioned performance limiting features.

According to the present invention there is provided a p.c.m. encoder/decoder arrangement comprising at least one transmit amplifier, at least one receive amplifier, a comparator, an analogue-to-digital converter of the ladder network type, a constant current generator and means for switching the constant current generator to drive the transmit amplifier or the receive amplifier, the arrangement being connected such that the output of the transmit amplifier, the input of the receive amplifier, the output of the ladder network and the input of the comparator are all connected together and (i) when the arrangement is operating in the encoding mode the constant current generator is switched to drive the transmit amplifier which is also fed by the analogue sample to be transmitted and the current produced by the transmit amplifier is applied to the comparator and the comparator is arranged to detect a null current when the current produced by the ladder network is equal to that produced by the transmit amplifier and (ii) when operating in the decoding mode the ladder network produces an analogue sample in accordance with a digital sample to be decoded and the constant current generator is switched to drive the receive amplifier to produce an output analogue sample indicative of the signal decoded.

The invention will be more readily understood from the following description which is of one embodiment only and should be read with reference to the accompanying drawings in which.

Figure 1:
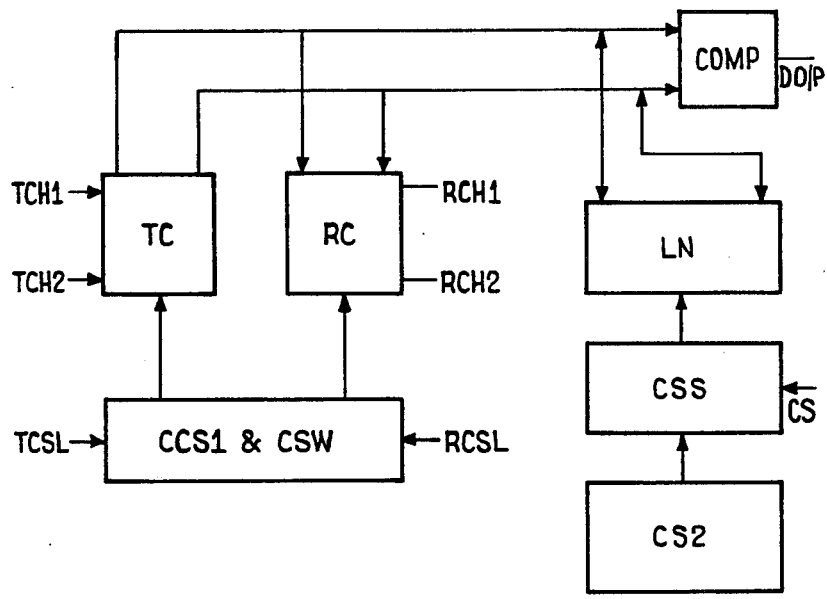
FIG. 1 shows a block diagram of the analogue-to-digital converter.

Referring to FIG. 1 a block diagram of an analogue-to-digital converter according to the invention is shown. Two input and two output channels are shown and the following description will consider only one input and one output channel for simplicity. The converter can be used as a dual channel coder/decoder without the need for any external multiplexing or alternatively using external multiplexing arrangements it can be shared by up to eight bothway channels performing both encoding or decoding functions, or as an encoder or a decoder only, it can be shared by at least sixteen channels. Referring to FIG. 1 in detail:

Transmit Channel TC

The Transmit Channel TC is shown having two input channels TCH1 and TCH2 for each of which there is provided a transmit channel amplifier which is activated when the analogue-to-digital (A-D) converter is used as an encoder. An audio input signal is presented to one of the amplifiers and a differential voltage is produced which is presented to the comparator COMP and Ladder Network LN.

Receive Channel RC

The Receive Channel RC is shown having two output channels RCH1 and RCH2, for each of which there is provided a receive channel amplifier which is activated when the A-D converters is used as a decoder. An analogue voltage is fed from the Ladder Network LN to the amplifier which produces an audio output signal.

Constant Current Source 1, CCS1 and Channel Switches CSW

A Constant current source is provided which is shared by the transmit channel amplifier channel 1 and the receive channel amplifier channel 1. Each receive and transmit channel amplifier has an associated channel switch which is used to direct current to a particular channel transmit or a receive amplifier to make each such amplifier active. Each switch is activated by a signal presented to its associated channel select logic lead CSL.

Current Sources 2, CS2 and Current Steering Switches CSS

The Current Sources CS2 provide a constant current supply to the Ladder Network LN. It utilises a band gap reference which gives a constant output voltage. The current is switched to the Ladder Switching network LN by way of a transistor diode matrix forming current steering switches; each switch being controlled by a respective control signal CS. Six current sources and switches are provided each providing a different current output value, and the sum total of the currents from each operated current switch is fed to the Ladder Network LN.

Ladder Network LN

The Ladder Network LN employs a positive network and a negative network each of R-R2 resistors and a constant current is injected into the networks at various points in each R-2R network and is used to give at the terminating resistors balanced currents which are fed to the comparator COMP.

Comparator COMP

Comparator COMP has two input leads and produces at its output a digital signal D O/P. When the positive input is greater than the negative input a logic '1' appears at the output and when the negative input is greater than the positive input a logic '0' signal appears at the output.

Figure 2:
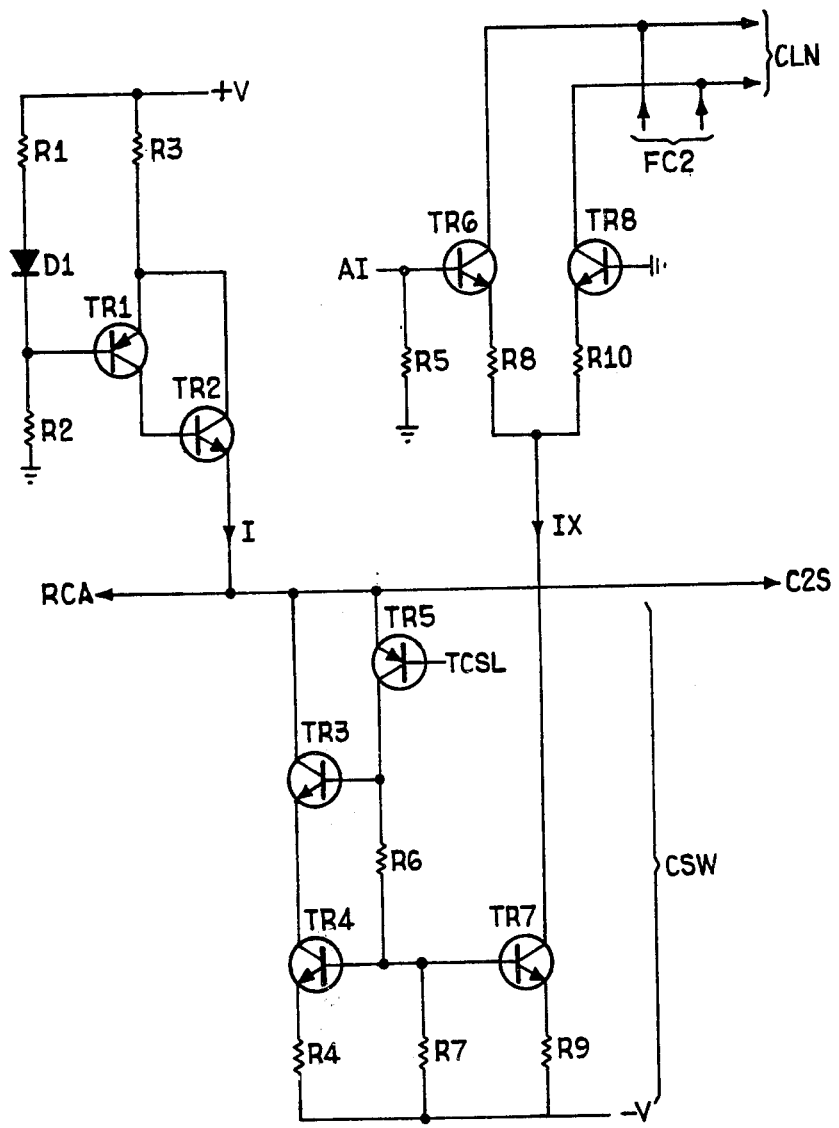
FIG. 2 shows a circuit diagram of a transmit channel amplifier including a first current source and an associated current switch.

Referring to FIG. 2 the operation of the transmit channel amplifier will now be described.

Transistors TR1 and TR2 together with diode D1 and resistors R1-R3 provide a constant current source. Resistor R1 is connected to a positive voltage rail and a current path is provided through resistor R1, diode D1 and resistor R2 to earth. The junction of diode D1 and resistor R2 is connected to the base of transistor TR1 which is biased to turn on allowing emitter/collector current to flow by way of resistor R3 to the base of transistor TR2, turning it on allowing collector/emitter current I to flow by way of resistor R3. The current I can be directed to the receive channel amplifier by way of lead RCA, the current switch associated with channel 2 over lead C2S or to the transmit channel amplifier, channel 1 as shown in FIG. 2 by operating a current switch CSW comprising the configuration of transistors TR3-TR5 and TR7 and resistor R4, R6, R7 and R9 and (to the receive or transmit channel amplifier in channel 2). To select the transmit channel amplifier (channel 1) an appropriate select signal TCSL is presented to the base of transistor TR5. Transistor TR5 switches on and some of the current I flows through the emitter and collector and resistors R6 and R7 to the negative potential rail. Transistor TR3 switches on since its base is connected at the junction of resistors R6 and R7 permitting some of the current I to flow through the collector and emitter of transistors TR3 and TR4 and through R4 which is connected to the emitter of transistor TR4 to the negative potential rail. The base of transistor TR7 is connected to the base of transistor TR4 and switches on at the same time as transistor TR4, allowing current IX to flow through the collector/emitter and resistor R9 to the negative potential rail. By allowing current IX to flow the transmit channel amplifier has been selected. The amplifier consists of transistors TR6 and TR8 and resistors R5, R8 and R10. Transistors TR6 and TR8 form a long-tail pair comparator. Resistor R5 is connected to earth and the opposite end connected to the base of transistor TR6. The emitter of transistor TR6 is connected to the collector of transistor TR7 by way of resistor R8 and similarly the emitter of transistor TR8 is connected to the collector of transistor TR7 by way of resistor R10. The collector of transistor TR8 is connected to a comparator and ladder network over lead CLN to be described in detail later, and the base is connected to earth. The collector of transistor TR6 is connected to the comparator and ladder network also by way of lead CLN. The output of the collector of transistor TR6 will change with respect to the output of collector of transistor TR7 in accordance with the variation of the audio input signal AI presented to the base of transistor TR6 with respect to the earth signal on the base of transistor TR8. Signal Leads FC2 connect the amplifier associated with channel 2 to the ladder networks and comparator of FIG. 3.

Figure 3:
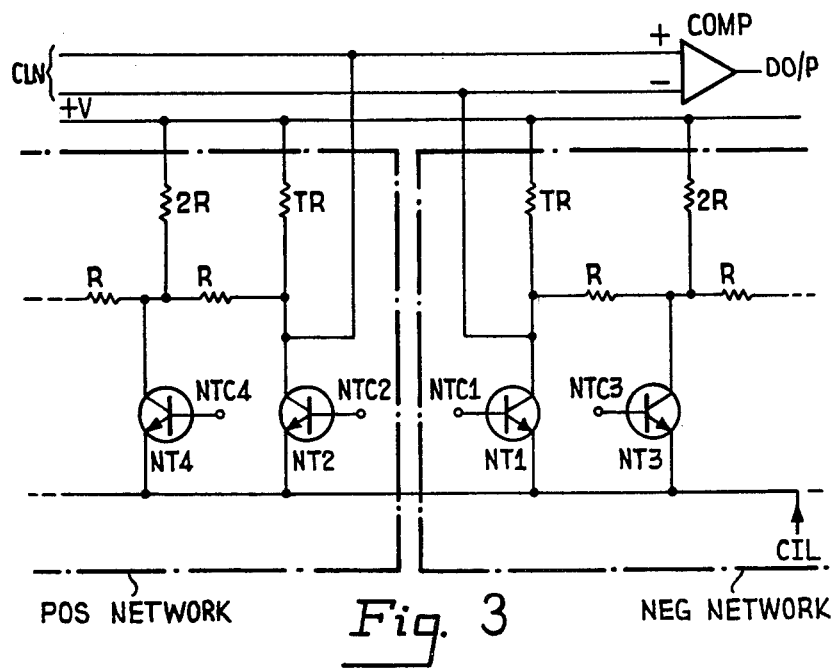
FIG. 3 shows a pair of ladder networks and a comparator.

Referring to FIG. 3, the comparator and ladder networks are shown. The inputs of the comparator COMP are connected to the transmit amplifier as discussed with reference to FIG. 2 over leads CLN. The comparator COMP produces a digital output signal DO/P. Each input to the comparator COMP is also connected to the positive ladder network and the negative ladder network respectively. Each ladder network is of the R-2R type and each consists of seven stages of R-2R resistors one end of the 2R and TR resistors being commoned to the positive voltage rail. When the converter is used as an encoder each input from the transmit channel amplifier is connected to one of the two terminating resistors TR which equals R of each network and the current transmitted produces a differential voltage across the TR resistors. This voltage is balanced by a voltage generated by current from the current sources (FIG. 5) to be described later injected into one of the nodes of the ladder networks, over lead CIL therefore, producing a null at the comparator inputs. A node appears at the junction of each R-2R resistor which is connected to the current source by a node switching transistor NT1-4 through the collector/emitter of each transistor. A node, through which the current is to pass is selected by means of an appropriate node transistor control signal applied to the base of each transistor NTC1-NTC4 respectively.

Figure 5:
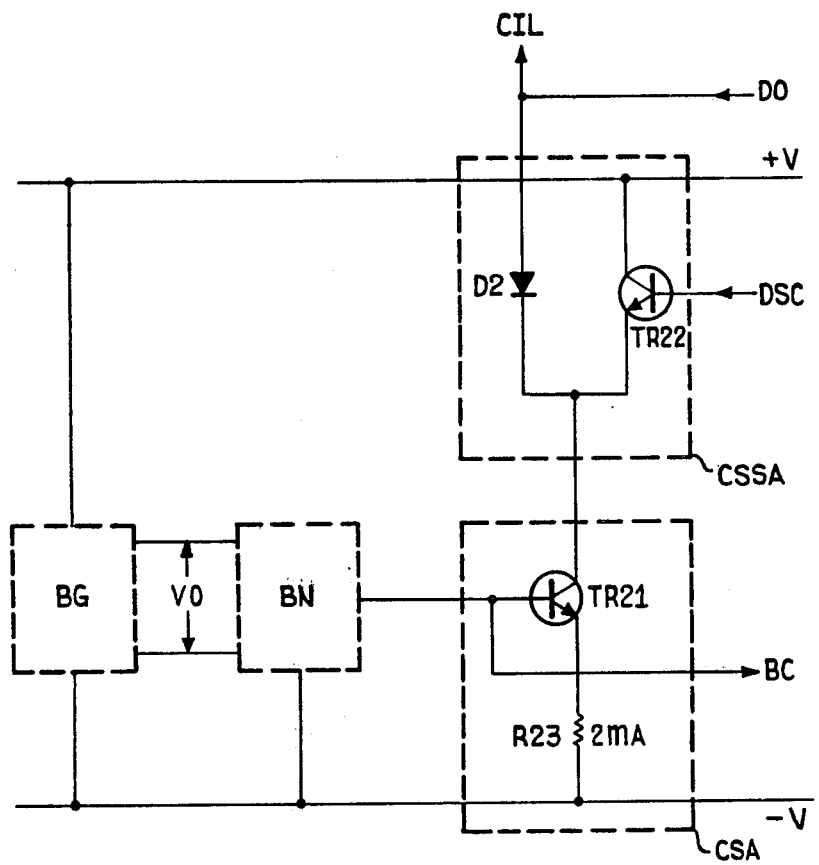

When the converter is used as a decoder the digital signal to be decoded is presented to the second current sources FIG. 5 which is made active and the current from the second current sources is presented to the ladder networks by way of transistors NT1-NT4 and an analogue voltage is produced across the ladder network terminating resistors TR which is amplified by the receive channel amplifier. The signal conditions presented to transistor bases NTC1-NTC4 defines a particular segment number of the A law characteristic and the position in the segment is defined by selecting a combination of current sources as shown in FIG. 5 to be described later.

Figure 4:
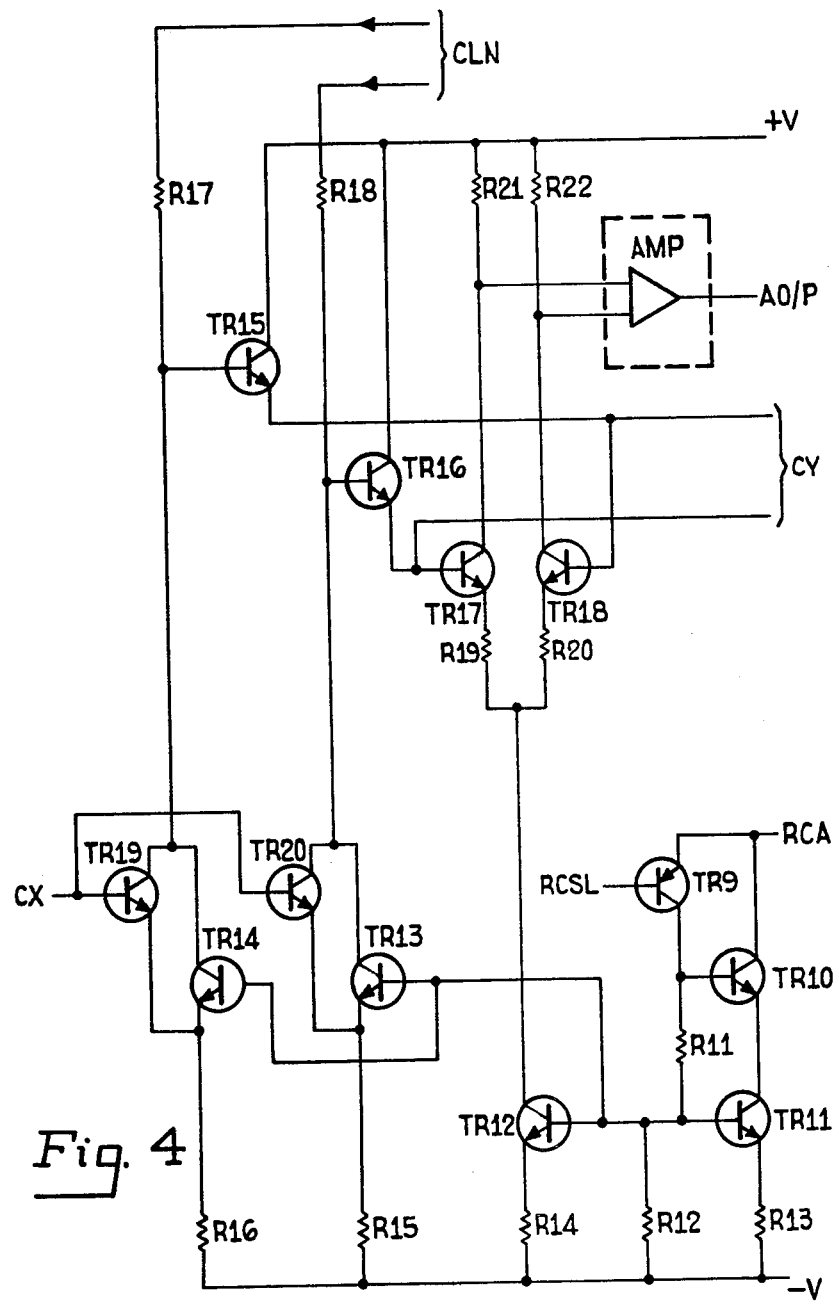
FIG. 4 shows a circuit diagram of a receive channel amplifier and an associated current switch and FIG. 5 shows a second current source and current steering switches.

Referring to FIG. 4 the operation of the receive channel amplifier will now be described.

The receive amplifier is selected by an appropriate select signal RCSL being applied to the base of transistor TR9, the emitter being connected to the current source over lead RCA as described with reference to FIG. 2. Transistor TR9 switches on and emitter/collector current flows by way of resistors R11 and R12 to the negative voltage rail. The collector of transistor TR9 is connected to the base of transistor TR10 and is similarly switched on and collector/emitter current flows since the emitter is connected to the collector of transistor TR11 and the base of transistor TR11 is connected to the junction of resistors R11, and R12 and is biased in such a manner to switch on when transistor TR10 switches on, therefore, allowing current to flow by way of resistor R13, connected to the emitter of transistor TR11, to the negative voltage rail. The base of transistors TR12, TR13 and TR14 are connected to the base of transistor TR11 and similarly have their associated emitters connected to the negative voltage rail by way of resistors R14, R15 and R16 respectively and are switched on when transistor TR11 is switched on. When transistors TR13 and TR14 switch on and the analogue voltage across the ladder network terminating resistors applied across leads CLN, which is indicative of the digital signal being decoded, current is caused to flow by way of resistors R17 and R18 which are connected to the collectors of TR14 and TR13 respectively and to the bases of transistors TR15 and TR16 respectively. Transistors TR15 and TR16 have their collectors connected to the positive voltage rail, the respective emitters of which are connected to the base of transistors TR17 and TR18. Transistors TR17 and TR18 together with resistors R19 and R20 connected to the emitters of transistors TR17 and TR18 respectively form a long tail-pair amplifier, the opposite ends of resistors R19 and R20 being connected to the collector of transistor TR12. The amplifier is made active by transistor TR12 switching on. The collectors of transistors TR17 and TR18 are connected to the positive voltage rail by way of resistors R21 and R22 respectively and the collectors are also directly connected to an amplifier AMP which produces an audio output signal A O/P which is dependent upon the collector outputs of transistors TR17 and TR18. Transistors TR19 and TR20 have their respective collectors connected to the ladder network by way of resistors R17 and R18 over leads CLN, and their respective emitters connected to the negative voltage rail by way of resistors R16 and R15. The bases are commoned together and are driven from the current switch and channel selection circuit pertaining a channel 2 (not shown) by way of lead CX. The emitters of transistors TR15 and TR16 are also connected to the respective bases of the transistors comprising the long-tail pair amplifier pertaining to channel 2 (not shown) by way of leads CY.

Referring to FIG. 5 the second current sources and current steering switches will now be described. A band gap reference circuit BG is used the output of which Vo is stable and independent of temperature change. The output voltage Vo is applied to a bias network BN the function of which is to provide an output current to drive the current sources of which one is shown designated CSA. The bias network BN could conveniently consist of a voltage comparator in which the band gap reference voltage is compared with a voltage developed across a resistor network the developed voltage remaining constant by means of negative feedback. The current source CSA consists of a transistor TR1 connected to the negative voltage rail by way of resistor R23, the value of which is chosen to give a current of 2mA. Five similar stages are provided each giving a current ranging in steps to 0.0625 mA. The bases of the relevant transistors are connected to the bias network BN by way of lead BC. The collector of transistor TR21 is connected to a current steering switch consisting of a transistor TR22 the emitter of which is connected to the collector of transistor TR21. The collector of transistor TR22 is connected to the positive voltage rail. When the switch is activated by a signal DSC presented to the base of transistor TR22 the current is directed to the ladder network (FIG. 3) by way of diode D2 over lead CIL. Five similar current steering switches are provided, one for each current source and their output currents are fed to the ladder network over lead DO and their combination defines the position in a particular segment in accordance with the A law characteristic.

The above description has been of one embodiment only and is not intended to limit the scope of the invention. The analogue-to-digital converter discussed can be considered as a basic building block in PCM telecommunications systems, such systems being expanded as necessary to suit particular applications.

What we claim is:

1. A p.c.m. encoder/decoder arrangement comprising at least one transmit amplifier, at least one receive amplifier, a comparator, an analogue-to-digital converter of the ladder network type, a constant current generator and means for switching the constant current generator to drive the transmit amplifier or the receive amplifier, said means for switching the constant current generator to the input or output amplifiers comprising a current steering switch provided for each transmit and receive amplifier, wherein each current steering switch comprises a first transistor which is activated by a select signal which causes current to flow through the emitter and collector and collector load resistors of said first transistor to a negative potential rail, said first transistor causing a second and third transistor to conduct current to the negative potential rail via an emitter load resistor, said second and third transistors having their respective collector and emitter connected in series and a fourth transistor which is activated when said third transistor is activated which thereby causes the respective transmit or receive amplifier to be activated, the arrangement being connected such that the output of the transmit amplifier, the input of the receive amplifier, the output of the ladder network and the input of the comparator are all connected together and (i) when the arrangement is operating in the encoding mode the constant current generator is switched to drive the transmit amplifier which is also fed by the analogue sample to be transmitted and the current produced by the transmit amplifier is applied to the comparator and the comparator is arranged to detect a null current when the current produced by the ladder network is equal to that produced by the transmit amplifier and (ii) when operating in the decoding mode the ladder network produces an analogue sample in accordance with a digital sample to be decoded and the constant current generator is switched to drive the receive amplifier to produce an output analogue sample indicative of the signal decoded.

2. A p.c.m. encoder/decoder arrangement according to claim 1 in which the constant current generator comprises first and second constant current generator transistors, the collector of the first constant current generator transistor is connected to the base of the second constant current generator transistor, and the collector of the second constant current generator transistor is connected to the emitter of the first constant current generator transistor and to a positive potential rail by way of an emitter load resistor; the base of the first constant current generator transistor is connected to an earth rail by way of a load resistor and to the positive potential rail by way of a diode and resistor, whereby the constant current is generated from the emitter of the second constant current generator transistor.

3. A p.c.m. encoder/decoder arrangement according to claim 1 in which the ladder network provides a plurality of current paths each having an associated switching device to make the respective current path active and all switching devices are connected to a plurality of current sources each of which comprise a current source transistor having its emitter connected to the negative potential rail by way of a source resistor, each source resistor having a different value chosen to give a different current in a defined range each base of each current source transistor is connected to a voltage source and each collector of each current source transistor is connected via a respective ladder network switching device to its associated switching device.

4. A p.c.m. encoder/decoder arrangement according to claim 3 in which the respective ladder network switching device comprises a ladder network transistor having its collector connected to the positive potential rail and its emitter connected to the current source and to the switching device associated with the respective current path of the ladder network by way of a diode, said ladder network transistor connected to have an activation signal applied to its base.

* * * * *